(12) United States Patent
Chan et al.

(10) Patent No.: US 6,355,498 B1
(45) Date of Patent: Mar. 12, 2002

(54) THIN FILM RESONATORS FABRICATED ON MEMBRANES CREATED BY FRONT SIDE RELEASING

(75) Inventors: Edward Chan, New Providence; Harold Alexis Huggins, Watchung; Jungsang Kim; Hyongsok Soh, both of Basking Ridge, all of NJ (US)

(73) Assignee: Agere Systems Guartian Corp., Orlando, FL (US)

( * ) Notice: Subject to any disclaimer, the term of this patent is extended or adjusted under 35 U.S.C. 154(b) by 0 days.

(21) Appl. No.: 09/637,069

(22) Filed: Aug. 11, 2000

(51) Int. Cl.$^7$ ............................................. H01L 21/00
(52) U.S. Cl. ...................................... 438/48; 438/738
(58) Field of Search ............................... 438/22, 48, 50, 438/773, 734, 735, 738, 751, 900

(56) References Cited

U.S. PATENT DOCUMENTS

| | | | | |
|---|---|---|---|---|
| 4,456,850 A | * | 6/1984 | Inoue et al. | 310/324 |
| 4,502,932 A | | 3/1985 | Kline et al. | 204/192 EC |
| 4,556,812 A | | 12/1985 | Kline et al. | 310/324 |
| 4,719,383 A | | 1/1988 | Wang et al. | 310/324 |
| 4,890,370 A | | 1/1990 | Fukuda et al. | 29/25.35 |
| 4,988,957 A | | 1/1991 | Thompson et al. | 331/107 |
| 5,075,641 A | | 12/1991 | Weber et al. | 331/108 C |
| 5,166,646 A | | 11/1992 | Avanic et al. | 331/107 A |
| 5,185,589 A | | 2/1993 | Krishnaswamy et al. | 333/133 |
| 5,231,327 A | | 7/1993 | Ketcham | 310/366 |
| 5,232,571 A | | 8/1993 | Braymen | 204/192.22 |
| 5,233,259 A | | 8/1993 | Krishnaswamy et al. | 310/324 |
| 5,260,596 A | | 11/1993 | Dunn et al. | 257/414 |
| 5,283,458 A | | 2/1994 | Stokes et al. | 257/416 |
| 5,291,159 A | | 3/1994 | Vale | 333/188 |
| 5,294,898 A | | 3/1994 | Dworsky et al. | 333/187 |
| 5,303,457 A | | 4/1994 | Falkner, Jr. et al. | 29/25.35 |
| 5,334,960 A | | 8/1994 | Penunuri | 333/193 |
| 5,348,617 A | | 9/1994 | Braymen | 156/644 |
| 5,367,308 A | | 11/1994 | Weber | 343/700 MS |
| 5,373,268 A | | 12/1994 | Dworsky et al. | 333/187 |
| 5,381,385 A | | 1/1995 | Greenstein | 367/140 |
| 5,403,701 A | | 4/1995 | Lam et al. | 430/315 |
| 5,404,628 A | | 4/1995 | Ketcham | 29/25.35 |
| 5,438,554 A | | 8/1995 | Seyed-Bolorforosh et al. | 367/140 |

(List continued on next page.)

OTHER PUBLICATIONS

R. Ruby, P. Merchant, "Micromachined thin film bulk acoustic resonators", Proceedings of IEEE 48$^{th}$ Annual Symposium on Frequency Control, p. 135, 1994.

Rich Ruby, "Micromachined cellular filters", IEEE MTT–S International Microwave Symposium Digest, p. 1149, 1996.

R. Ruby, P. Bradley, J.D. Larson III, Y. Oshmyansky, "PCS 1900 MHz duplexer using thin film bulk acoustic resonators (FBARs)" Electronics Letters, p. 794, vol.35, No. 10 1999.

*Primary Examiner*—David Nelms
*Assistant Examiner*—David Nhu
(74) *Attorney, Agent, or Firm*—Ratner & Prestia

(57) ABSTRACT

A new bulk resonator may be fabricated by a process that is readily incorporated in the traditional fabrication techniques used in the fabrication of monolithic integrated circuits on a wafer. The resonator is decoupled from the wafer by a cavity etched under the resonator using selective etching through front openings (vias) in a resonator membrane. In a typical structure the resonator is formed over a silicon wafer by first forming a first electrode, coating a piezoelectric layer over both the electrode and the wafer surface and forming a second electrode opposite the first on the surface of the piezoelectric layer. After this structure is complete, a number of vias are etched in the piezoelectric layer exposing the surface under the piezoelectric layer to a selective etching process that selectively attacks the surface below the piezoelectric layer creating a cavity under the resonator.

15 Claims, 3 Drawing Sheets

U.S. PATENT DOCUMENTS

| | | | | |
|---|---|---|---|---|
| 5,446,306 A | | 8/1995 | Stokes et al. | 257/416 |
| 5,552,655 A | | 9/1996 | Stokes et al. | 310/330 |
| 5,559,358 A | | 9/1996 | Burns et al. | 257/431 |
| 5,587,620 A | | 12/1996 | Ruby et al. | 310/346 |
| 5,596,239 A | | 1/1997 | Dydyk | 310/311 |
| 5,617,065 A | | 4/1997 | Dydyk | 333/186 |
| 5,630,949 A | | 5/1997 | Lakin | 216/61 |
| 5,646,583 A | | 7/1997 | Seabury et al. | 333/187 |
| 5,692,279 A | | 12/1997 | Mang et al. | 29/25.35 |
| 5,698,928 A | | 12/1997 | Mang et al. | 310/322 |
| 5,702,775 A | | 12/1997 | Anderson et al. | 428/1 |
| 5,714,917 A | | 2/1998 | Ella | 332/144 |
| 5,760,663 A | | 6/1998 | Pradal | 333/187 |
| 5,780,713 A | | 7/1998 | Ruby | 73/1.82 |
| 5,789,845 A | | 8/1998 | Wadaka et al. | 310/334 |
| 5,821,833 A | | 10/1998 | Lakin | 333/187 |
| 5,853,601 A | * | 12/1998 | Krishaswamy et al. | 216/2 |
| 5,864,261 A | | 1/1999 | Weber | 333/187 |
| 5,872,493 A | | 2/1999 | Ella | 333/191 |
| 5,873,153 A | * | 2/1999 | Ruby et al. | 29/25.35 |
| 5,873,154 A | | 2/1999 | Ylilammi et al. | 29/25.35 |
| 5,883,575 A | | 3/1999 | Ruby et al. | 340/572.5 |
| 5,884,378 A | | 3/1999 | Dydyk | 29/25.35 |
| 5,894,647 A | | 4/1999 | Lakin | 29/25.35 |
| 5,910,756 A | | 6/1999 | Ella | 333/133 |
| 5,928,598 A | | 7/1999 | Anderson et al. | 264/446 |
| 5,942,958 A | | 8/1999 | Lakin | 333/189 |
| 5,963,856 A | | 10/1999 | Kim | 455/307 |
| 6,051,907 A | | 4/2000 | Ylilammi | 310/312 |
| 6,060,818 A | | 5/2000 | Ruby et al. | 310/363 |
| 6,081,171 A | | 6/2000 | Ella | 333/189 |
| 6,087,198 A | | 7/2000 | Panasik | 438/51 |
| 6,127,768 A | | 10/2000 | Stoner et al. | 310/313 A |
| 6,150,703 A | * | 11/2000 | Cushman et al. | 257/415 |
| 6,198,208 B1 | | 3/2001 | Yano et al. | 310/358 |
| 6,204,737 B1 | | 3/2001 | Ella | 333/187 |
| 6,215,375 B1 | | 4/2001 | Larson, III et al. | 333/187 |

* cited by examiner

THIN FILM RESONATORS FABRICATED ON MEMBRANES CREATED BY FRONT SIDE RELEASING

BACKGROUND OF THE INVENTION

1. Field of the invention

This invention relates to electrical bulk resonators and more particularly to a method for manufacturing a thin film resonator on a membrane over a cavity on a semiconductor substrate as part of a monolithic integrated circuit.

2. Description of Related Art

In the design of radio receivers, particularly paging receivers, cellular radios, and microwave satellite communication systems, it is desirable for components which form the system to take up as little space as possible. It is desirable for as many components as possible to be integrated into a single integrated circuit in the form of monolithic circuits.

A monolithic integrated system, requires less space, is more reliable, has a lower power consumption, has more precise temperature control, and has a higher shock tolerance, than one which requires multiple independent components. It is also easier to produce matched resonator and oscillator circuits when they are produced on the same substrate, and, typically monolithic structures present lower manufacturing costs at every stage of design and production. Thus the advantages of monolithic integration are numerous.

An important element used in the type of equipment mentioned above is an electronic filter. The present state of the art employs resonant electromechanical structures in designing such filters. The structures and materials used depend on the frequencies of the signals involved, and can be separated into three major categories, (a) mechanical, (b) quartz crystals and (c) piezoelectric materials.

The later are particularly useful for frequencies above about 300 Mhz where a thin film non-conductive piezoelectric resonator is commonly used. Such resonators may be one of two basic types, a surface acoustic resonator (SAW) or a bulk acoustic resonator (BAW). SAW resonators don't respond well at frequencies above 2 GHz, and are not able to handle radio frequency (RF) signals at high power.

BAW resonators on the other hand, do not suffer such limitations. BAW resonators in their basic form comprise a piezoelectric material sandwiched between two opposing electrodes. Such resonators, however, in order to perform with the required efficiency require an unsupported structure, which means that when such resonators are used as a part of an integrated circuit structure, such as a CMOS, they should be placed either over a cavity in the semiconductor support, or should be elevated therefrom. In addition such BAW resonators, in order to be commercially useful, should be able to be manufactured as part of the normal CMOS and Bipolar silicon processing techniques.

The art has both recognized the advantages of a monolithic BAW resonator and the need to build such resonator as an unsupported structure. A solution to this design problem is proposed in U.S. Pat. No. 5,260,596, issued Nov. 9, 1993 to Dunn et al.

According to Dunn et al. unsupported mechanical, quartz and piezoelectric electromechanical resonators may be constructed on a support such as a silicon semiconductor wafer, by first micro-machining a cavity in the substrate and filling the cavity with a sacrificial non silicon filler such as a phosphorous silicate glass (PSG). The resonator is next built on the sacrificial filler and extends beyond the cavity limits to the substrate surface. The filler provides support during the manufacturing steps. Once the resonator structure is completed the sacrificial filler is removed by etching. The result is a BAW resonator that is constructed over a cavity and is, therefore substantially unsupported.

While the disclosed resonator offers advantages over prior resonators, the method of its fabrication, which requires first creating the cavity, then filling and finally etching the filler away from under the resonator itself, is not a method that can be readily incorporated in the traditional fabrication techniques used in the fabrication of monolithic integrated circuits. Further more, the etching process to remove the filler material disclosed in the prior art is a liquid etching process which also attacks aluminum and which sometimes washes away small parts of the circuit.

Clearly there is still a need for a resonator which can be monolithically integrated with other semiconductor devices, in which the bulk structure resonator is not in contact with anything which would inhibit vibration. However, there is also as clearly a need for a method to fabricate this resonator which can be readily integrated in the typical monolithic integrated circuit manufacturing processes and which is less harsh on the materials used to construct the resonator.

It is, therefore, an object of the present invention to provide a method and resulting resonator whose manufacturing steps may be readily integrated in a typical CMOS or Bipolar Silicon processing or added to such process as a post process step.

SUMMARY OF THE INVENTION

The above object is obtained in accordance with this invention through a new bulk resonator incorporated in the traditional fabrication techniques used in the fabrication of monolithic integrated circuits on a wafer. The resonator is decoupled from the wafer by a cavity etched under the resonator using selective etching through front openings (vias) in a resonator membrane.

As an example, the resonator may be a bulk type resonator, fabricated on a semiconductor wafer support preferably using a piezoelectric material, having the following structure:

(a) A semiconductor wafer support.
(b) A cavity extending through the surface of the wafer partially into the support body;
(c) a piezoelectric membrane extending over the support and the cavity. The membrane has an area over the cavity, an underside facing the support surface and a topside opposite the underside.
(d) A first electrode is adhered to the piezoelectric membrane underside over a portion of the membrane area over that extends over the cavity.
(e) There is a second electrode on the topside of the piezoelectric membrane over the first electrode and substantially coextensive with it.
(f) There is also at least one via in the piezoelectric membrane adjacent the first and second electrodes.

Preferably there is also a isolation layer between the wafer surface and the underside of the piezoelectric membrane, and the cavity is formed at least in the isolation layer. The isolation layer may be a high resistivity layer.

Such structure may be fabricated to generate a bulk resonator structure on a wafer by a method comprising the steps of:

(A) forming a isolation layer on an upper surface of the wafer;
(B) depositing over the isolation layer a first conductive layer and patterning the first conductive layer to form a first electrode;

(C) depositing over the isolation layer and first electrode a piezoelectric layer;

(D) forming a second electrode over the piezoelectric layer and over the first electrode;

(E) opening at least one via through the piezoelectric layer along at least one side of the first electrode and spaced therefrom; and (F) using a dry etching process to form a cavity under the first electrode and adjacent piezoelectric layer by etching away at least a portion of the isolation layer under the first electrode and adjacent portions of piezoelectric layer by introducing an etchant through the via, selected to etch the isolation layer and to not significantly attack the piezoelectric layer and the electrodes.

Typically, in step (C), a plurality of vias are opened, surrounding the first electrode and the dry etching step is a gaseous etch process. When the wafer is a silicon semiconductor wafer and the isolation layer is a sputtered silicon layer deposited over the wafer surface, the etching step preferably uses xenon difluoride ($XeF_2$).

Using the above method, one may fabricate during the normal manufacturing steps common in the fabrication of monolithic circuits a bulk acoustic resonator on a silicon wafer, with electrodes made of Al, and a AlN piezoelectric membrane. The membrane is self supporting and extends completely over a cavity etched under the electrodes in the supporting wafer. The membrane is isolated from the silicon semiconductor wafer surface by a high resistivity sputtered silicon layer deposited between the membrane undersurface and the silicon support surface, and includes a plurality of vias extending therethrough located adjacent to and around said electrodes.

BRIEF DESCRIPTION OF THE DRAWINGS

The invention can be more fully understood from the following description thereof in connection with the accompanying drawings described as follows.

DESCRIPTION OF THE PREFERRED EMBODIMENT(S)

Figure 1:
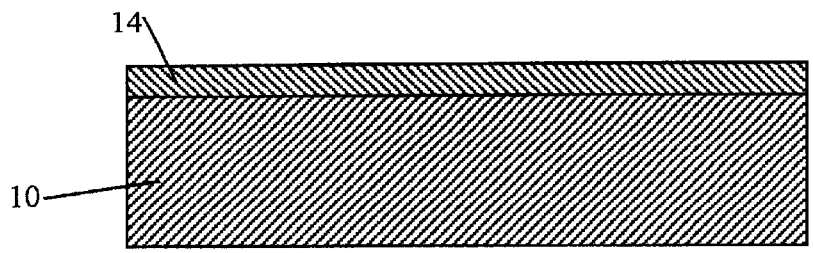
FIG. 1 shows in schematic elevation a portion of a wafer on which there is to be constructed a BAW resonator following a first step of a process to manufacture such resonator in accordance with this invention.

Throughout the following detailed description, similar reference characters refer to similar elements in all figures of the drawings. The drawings are illustrative only and are used in order to explain, rather than limit the invention.

Referring now to FIG. 1, there is shown a portion of a semiconductor support 10 which is preferably a silicon wafer. On a surface 12 of the wafer there is, preferably, deposited using conventional technology such as sputtering, an optional silicon layer to form a isolation layer 14. Preferably this layer is between about $2*10^{-6}$ and $5*10^{-6}$ meters thick.

Figure 2:
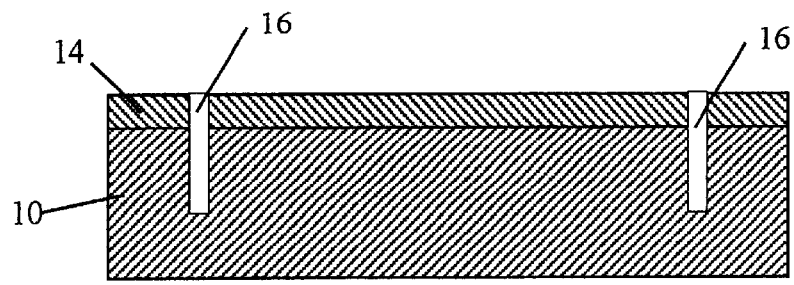
FIG. 2 shows in schematic elevation the same portion of the wafer shown in FIG. 1 following a second step of the process to manufacture such resonator in accordance with this invention.
Figure 3:
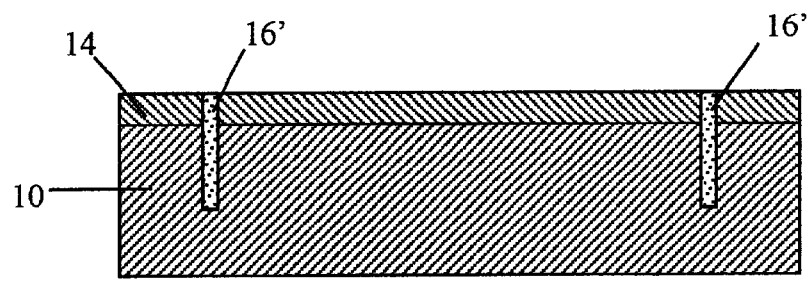
FIG. 3 shows in schematic elevation the same portion of the wafer shown in FIG. 2 following a third step of the process to manufacture such resonator in accordance with this invention.
Figure 9:
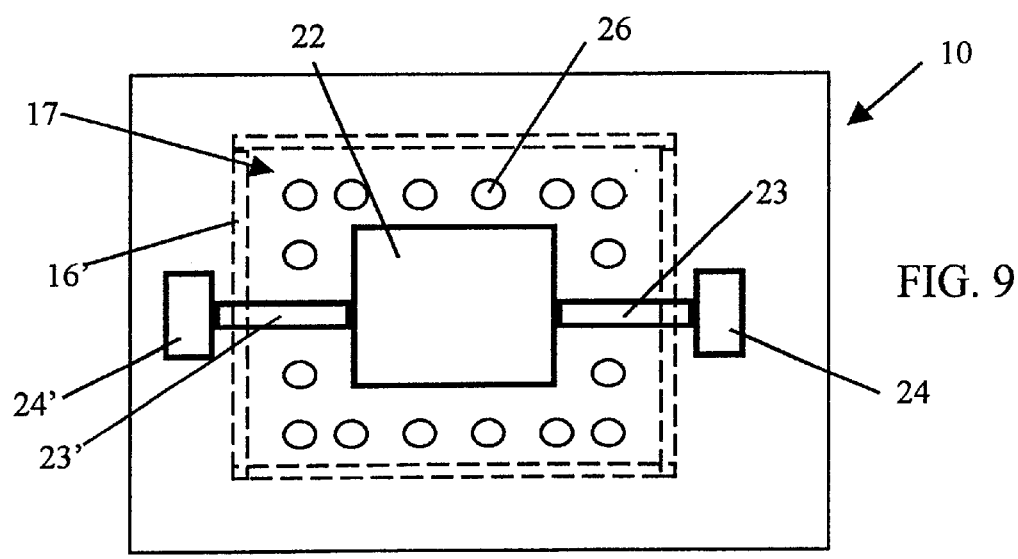
FIG. 9 is a schematic top view of the resonator structure depicted in FIG. 8.

A trench 16 (or a series of trenches) is next etched through the isolation layer 14 and into the silicon wafer delineating a desired area 17 as better shown in FIGS. 2 and 9. Etching of the trenches is preferably done using the well known Reactive Ion Etching technology, (RIE). The trenches are next filled with low temperature oxide (LTO), to produce an etch delimiting barrier 16' which is used in later step to contain the etching of the wafer and isolation layer to within the area within the desired area 17.

Figure 4:
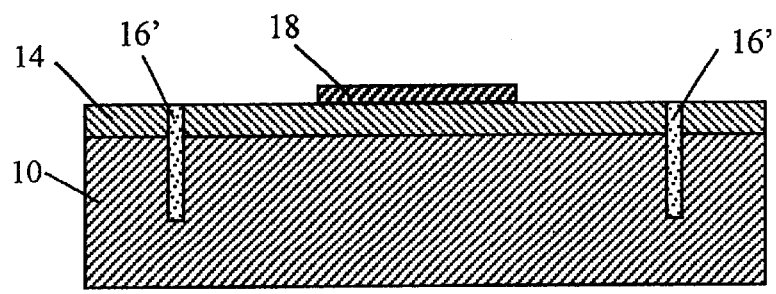
FIG. 4 shows in schematic elevation the same portion of the wafer shown in FIG. 3 following a fourth step of the process to manufacture such resonator in accordance with this invention.
Figure 5:
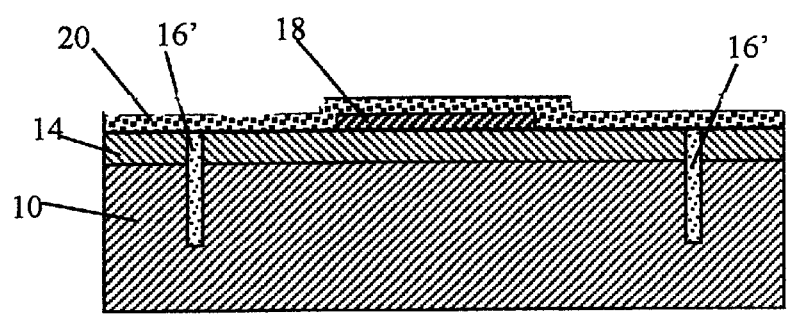
FIG. 5 shows in schematic elevation the same portion of the wafer shown in FIG. 4 following a fifth step of the process to manufacture such resonator in accordance with this invention.
Figure 6:
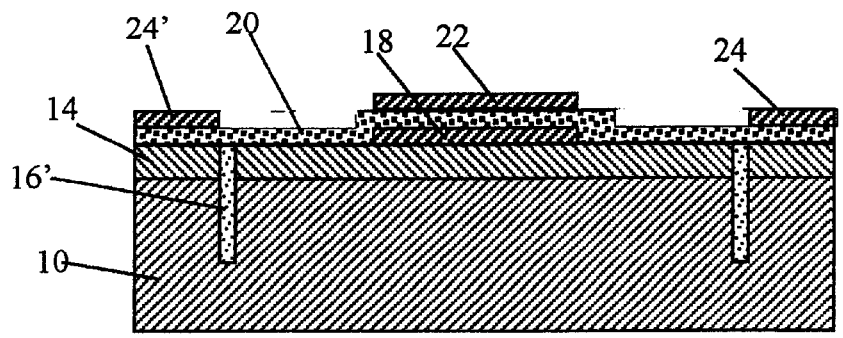
FIG. 6 shows in schematic elevation the same portion of the wafer shown in FIG. 5 following a sixth step of the process to manufacture such resonator in accordance with this invention.

A conductive layer such as aluminum is next deposited to a typical thickness of between about $0.2*10^{-6}$ and $0.3*10^{-6}$ meters over the isolation layer and patterned (masked and etched according to a desired pattern using photolithography) to form a first electrode 18 on the surface of the isolation layer within the desired area 17, as shown in FIG. 4. Once the first electrode has been created, there is deposited over the surface of the isolation layer and over the first electrode 18, a layer 20 of a piezoelectric material such as a layer of AlN. The piezoelectric AlN layer is deposited to a thickness of about $1*10^{-6}$ and $5*10^{-6}$ meters, preferably $2.7*10^{-6}$ meters. However the thickness of the piezoelectric material may be different depending on the design frequency response of the resonator.

Figure 7:
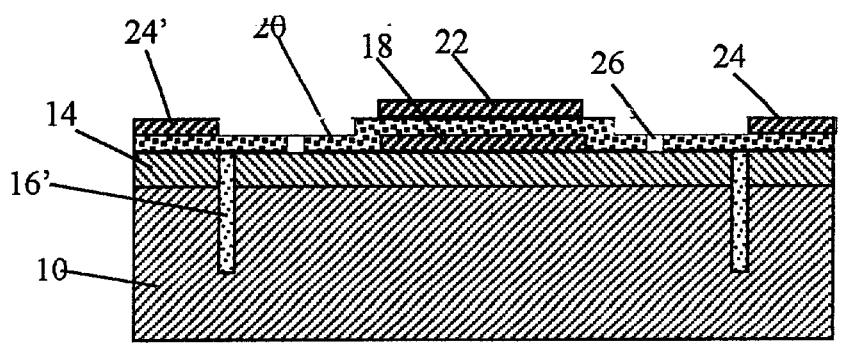
FIG. 7 shows in schematic elevation the same portion of the wafer shown in FIG. 6 following a seventh step of the process to manufacture such resonator in accordance with this invention.

A second conductive layer, again preferably an aluminum layer is deposited over the piezoelectric layer and patterned to form a second electrode 22 substantially coextensive and over the first electrode 18, as shown in FIG. 7. At the same time connector or bond pads 24 and optionally 24' are formed also over the piezoelectric material, preferably outside the desired area 17 delimited by the trenches filled with LTO. These pads are connected to the second electrode through a conductive path 23 and 23' respectively, which is also preferably formed by photolithographic patterning simultaneously with the second electrode and bond pads. The bond pads serve as external connection points for accessing the resonator.

Both the electrodes, conductive paths, bonding pads and the piezoelectric layer are preferably deposited using physical vapor deposition or sputtering. Depending on the desired resonant characteristics of the BAW resonator, the size of the electrodes will vary. Typical dimensions for a square shaped electrode pair are between $100*10^{-6}$ and $400*10^{-6}$ meters for the sides.

Once the second electrode has been formed, a number of vias 26 are formed, preferably by etching, through the piezoelectric material within the desired area 17. The vias are placed adjacent the electrodes and preferably evenly spaced all around the electrodes. Typical via diameters are between $5*10^{-6}$ and $20*10^{-6}$ meters, preferably about $10*10^{-6}$ meters and extend through the piezoelectric layer to the surface of the isolation layer 14.

Figure 8:
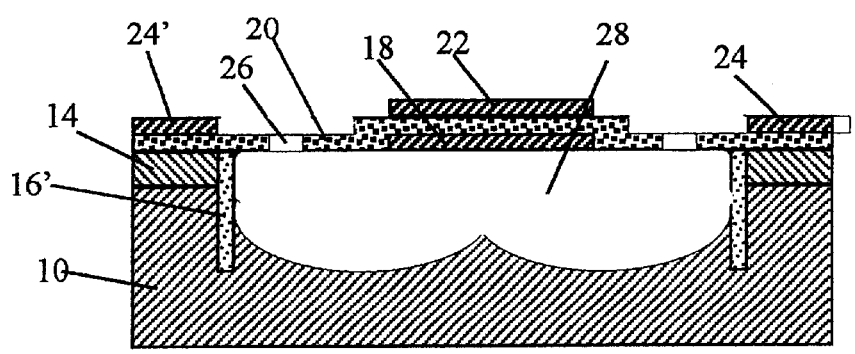
FIG. 8 shows in schematic elevation the same portion of the wafer with the resonator structure completed.

The next step, illustrated in FIG. 8, is the etching of a cavity 28 under the first and second electrodes so as to isolate from the support 10 the bulk resonator formed by the three layer combination of the first electrode 18, piezoelectric layer 20 and second electrode 22. This is accomplished in a dry etching process by introducing through the vias 26 an etchant, which is preferably a gaseous etchant that attacks the isolation layer and may also attack the underlying support, but does not attack the piezoelectric material or the electrodes. In a preferred resonator structure, a bulk acoustic resonator is formed using aluminum as the conductive material for the first and second electrodes and aluminum nitride (AlN) for the piezoelectric material. The support is a silicon wafer and the isolation layer is a high resistivity layer such as a silicon layer between the piezoelectric layer and the wafer surface. The etchant used is $XeF_2$ gas which attacks the silicon but does not attack the aluminum, the AlN or the LTO barriers. Thus introduction of the $XeF_2$ etches away an area beneath the AlN layer to form a cavity 28 leaving an AlN membrane extending over the cavity to the surface of the isolation layer on the supporting wafer having an unsupported area that includes the BAW resonator over the etched cavity. The cavity 28 may or may not extend all the way through the isolation layer. Typically the cavity depth is from about $2*10^{-6}$ meters to about $10*10^{-6}$ meters. Electrical connections to the bonding pads complete the resonator.

Figure 10:
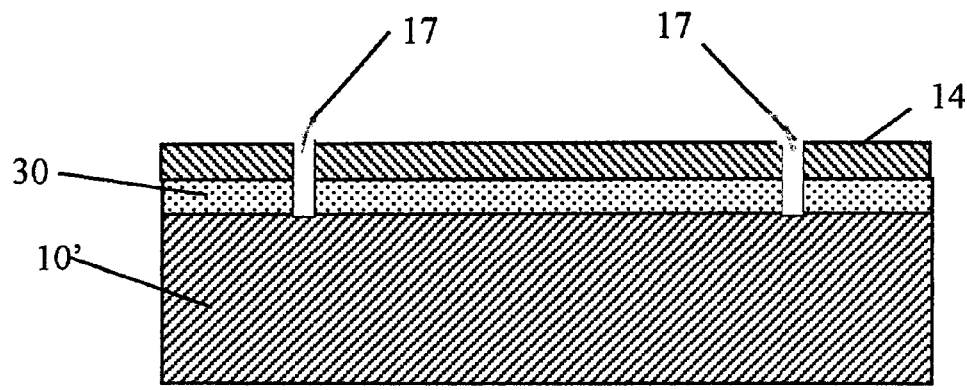
FIG. 10 shows in schematic elevation a wafer portion prepared for use in fabricating a resonator according with an alternate embodiment of this invention.
Figure 11:
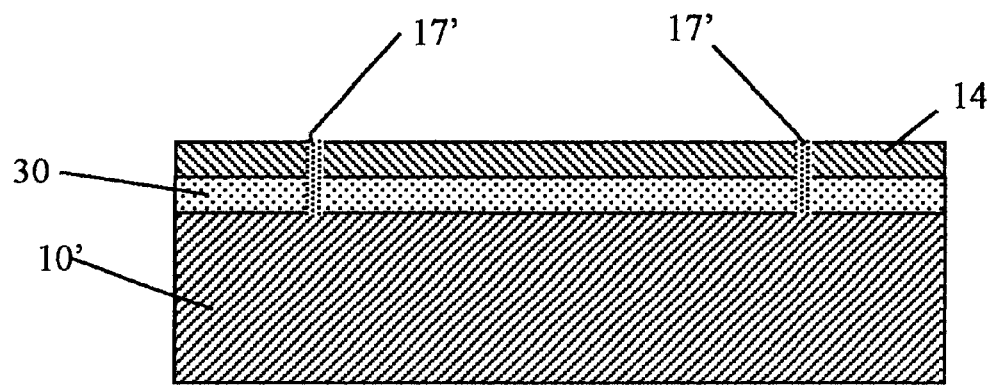
FIG. 11 shows in schematic elevation the same portion of the wafer shown in FIG. 10 following a second step of the process used to manufacture the alternate embodiment of the invention.
Figure 12:
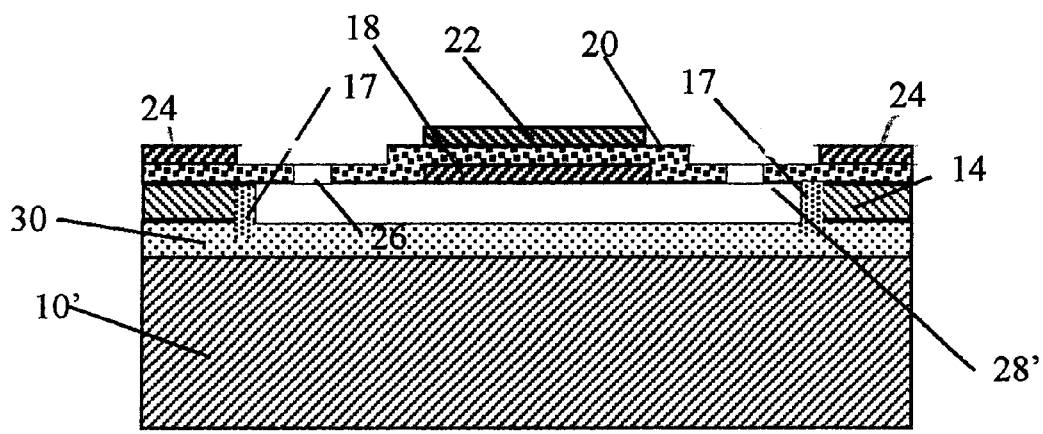
FIG. 12 shows in schematic elevation the same portion of the wafer shown in FIG. 11 with the alternate embodiment of the resonator completed.

In a variation of the above process illustrated in part by FIGS. 10, 11 and 12, the cavity 28' size may be designed fairly accurately by starting with a wafer 10' that already includes a bottom etch barrier 30. In the example given above where the support is a silicon wafer, such barrier may be created by first growing or depositing a $SiO_2$ layer 30 over the silicon wafer surface. The isolation layer 14, again typically a high resistivity Silicon layer, is next deposited over the $SiO_2$ layer, again preferably using sputtering.

Such wafer structure has a $SiO_2$ layer 30 substantially parallel with its surface, as shown in the figures. The remainder of the manufacturing process is the same as previously described with the barrier trenches 17 extending at least to the $SiO_2$ layer. The $SiO_2$ layer may be thermally grown or deposited (LTO). In this manner, as the $SiO_2$ layer is also not attacked by the $XeF_2$ gas, the portion of the support enclosed on top by the piezoelectric layer 20, and the first electrode 18, along the sides by the LTO filled trenches 17' and on the bottom by the $SiO_2$ layer 30 is etched away completely leaving behind a BAW resonator over a well defined cavity 28' as shown in FIG. 12.

The end result of the above process is a BAW resonator structure shown in schematic illustration in FIGS. 8, 9 and 12 in which the resonator is supported by a membrane held in isolation from an underlying supporting element, with the actual BAW resonator comprising a first electrode, a piezoelectric layer and a second electrode sandwiched between the first and second electrodes, held above the supporting element and not in contact with the supporting element.

Those having the benefit of the foregoing description of my invention may provide modifications to the embodiment herein described, such as size and shape of the resonator, cavity, vias etc. or may create filters containing more than one resonators adjacent to each other and interconnected electrically. These and other modifications are to be construed as being encompassed within the scope of the present invention as set forth in the appended claims wherein I claim:

We claim:

1. A method for fabricating a bulk acoustic resonator on a support wherein the resonator comprises a resonator membrane and wherein the resonator is decoupled from the support by a cavity etched in the support under the resonator, the method comprising using an etch delimiting barrier together with selective etching to etch said cavity through at least one via in said resonator membrane.

2. The method according to claim 1 wherein the selective etching step is selective dry etching.

3. The method according to claim 2 wherein the resonator also comprises a first and a second opposing electrodes on either side of said membrane, the membrane is a piezoelectric layer extending beyond said electrodes over at least a portion of said support and the method further comprises forming a plurality of vias in said piezoelectric membrane adjacent said electrodes prior to using said selective etching to form said cavity and using said selective etching to form said cavity in said support under said first electrode.

4. A method for fabricating a bulk resonator structure on a wafer comprising the steps of;
   (A) forming an isolation layer on an upper surface of said wafer;
   (B) forming at least one etch delimiting barrier in said wafer and said isolation layer,
   (C) depositing over said isolation layer a first conductive layer and patterning said first conductive layer to form a first electrode;
   (D) depositing over said isolation layer and first electrode a piezoelectric layer;
   (E) forming a second electrode over said piezoelectric layer and over said first electrode;
   (F) opening at least one via through said piezoelectric layer along at least one side of said first electrode and spaced therefrom; and
   (G) forming a cavity under said first electrode and adjacent piezoelectric layer by etching away at least a portion of said isolation layer under said first electrode and adjacent portions of piezoelectric layer, by introducing a selective etchant through said via.

5. The method according to claim 4 wherein said isolation layer is a high resistivity layer.

6. The method according to claim 4 wherein in step (G) the etching process is a dry etching process.

7. The method according to claim 4 wherein in step (G) the cavity extends through said isolation layer into a portion of said wafer.

8. The method according to claim 4 wherein step (F) comprises opening a plurality of vias and wherein said plurality of vias surrounds said first electrode.

9. The method according to claim 4 wherein said wafer is a silicon wafer.

10. The method according to claim 5 wherein said high resistivity layer is deposited by sputtering silicon to form a silicon layer.

11. The method according to claim 10 wherein the step of forming said first electrode comprises using aluminum.

12. The method according to claim 11 wherein the step of forming said piezoelectric layer comprises using AlN.

13. The method according to claim 4 wherein said wafer is a silicon wafer, said isolation layer is silicon and said etch delimiting barrier is a low temperature oxide.

14. The method according to claim 4 further comprising forming at least one conductive path connected to said second electrode.

15. The method according to claim 14 wherein said conductive path is formed over said piezoelectric layer and connects said second electrode to a wire bonding pad.

* * * * *